US006294802B1

(12) United States Patent
Unozawa

(10) Patent No.: US 6,294,802 B1
(45) Date of Patent: Sep. 25, 2001

(54) FIELD EFFECT TRANSISTOR AND METHOD OF MANUFACTURING THE SAME

(75) Inventor: Kousei Unozawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/351,398

(22) Filed: Jul. 12, 1999

(30) Foreign Application Priority Data

Jul. 10, 1998 (JP) .................................................. 10-196028

(51) Int. Cl.$^7$ .................................................. H01L 31/0328
(52) U.S. Cl. .................................................. 257/194
(58) Field of Search .................................................. 257/194

(56) References Cited

U.S. PATENT DOCUMENTS 5,521,404 * 5/1996 Kikkawa et al. .................... 257/194
5,751,028 * 5/1998 Kikkawa .............................. 257/192
5,811,844 * 9/1998 Kuo et al. ............................. 257/194

FOREIGN PATENT DOCUMENTS 8-306703   11/1996   (JP) .

* cited by examiner

Primary Examiner—Olik Chaudhuri
Assistant Examiner—Douglas A. Wille
(74) Attorney, Agent, or Firm—Hutchins, Wheeler & Dittmar

(57) ABSTRACT

A field effect transistor has an InGaAs channel layer and an InGaP electron donor layer on a GaAs substrate. A natural superlattice is formed in the crystal of the InGaP electron donor layer, and a gate finger is formed to run in the [−110] direction. A method of manufacturing this field effect transistor is also disclosed.

3 Claims, 4 Drawing Sheets

FIELD EFFECT TRANSISTOR AND METHOD OF MANUFACTURING THE SAME

BACKGROUND OF THE INVENTION

1. Field of the Invention

The present invention relates to a field effect transistor and a method of manufacturing the same and, more particularly, to a high-transconductance, high-performance field effect transistor and a method of manufacturing the same.

2. Description of the Prior Art

FIG. 1 shows the section of one structure of a conventional field effect transistor. As shown in FIG. 1, this structure is obtained by sequentially forming a 10-nm thick undoped GaAs buffer layer 32, a 10-nm thick undoped $In_{0.25}Ga_{0.75}As$ channel layer 33, a 25-nm thick Si-doped n-type $In_{0.48}Ga_{0.52}P$ electron donor layer 34 ($n=2\times10^{18}$ $cm^{-3}$), and a Si-doped n-type GaAs cap layer 36 ($n=2\times10^{18}$ $cm^{-3}$) on a GaAs substrate 31. In this structure, the two-dimensional sheet electron dose and mobility at room temperature are 1.4 to $1.5\times10^{12}$ $cm^{-2}$ and 7,000 $cm^2/V$ sec, respectively.

As the gate electrode formation process, a photoresist is applied to an oxide film ($Sio_2$), and a pattern is formed by electron beam exposure. A gate pattern is formed on the oxide film by reactive ion etching. Subsequently, using this oxide film as a mask, the GaAs cap layer 36 is etched by selective dry etching to reach the $In_{0.48}Ga_{0.52}P$ electron donor layer 34, thereby forming a recess. After that, WSi Schottky gate metal is formed by sputtering, and Au is formed by vapor deposition. Unnecessary gate metal is removed to form a gate electrode.

AuGe/Ni/Au is formed by vapor deposition to form ohmic electrodes, i.e., a source electrode 37 and a drain electrode 38.

Finally, an $SiO_2$/SiN passivation film is formed to obtain a conventional field effect transistor.

According to the characteristics of this conventional field effect transistor, when the transistor has a maximum transconductance gmmax of about 480 mS/mm, a gate-to-drain breakdown voltage BVgd of 7 V or more, and a gate width of 200 μm, a maximum oscillation frequency fmax is 191 GHz, and a cutoff frequency fT is 76 GHz. These figures are described in IEEE ELECTRON DEVICE LETTERS, VOL. 14, NO. 8, pp. 406–408 (1993).

As a reference that describes conditions for the crystal growth of the conventional field effect transistor described above, Journal of Crystal Growth, vol. 107, pp. 942–946 (1991) is cited. According to this reference, crystal growth is performed by setting the reaction tube pressure to normal pressure and setting the growing temperature to 630° C.

Japanese Unexamined Patent Publication No. 8-306703 and the like describe a compound semiconductor crystal device and a method of manufacturing the same.

The above references concerning the conventional field effect transistor have no description on the direction of the gate finger of the FET and the practical growth conditions for the $In_{0.48}Ga_{0.52}$ P electron donor layer 34, which forms an interface together with the $In_{0.25}Ga_{0.75}As$ channel layer 33 and in which the array of Ga and In layers, i.e., natural superlattice formation state changes depending on the growing temperature, the V/III ratio, the growing rate, and the substrate plane orientation.

In a field effect transistor (FET) using InGaAs as a channel layer, the state of interface between the channel layer and the electron donor layer formed on the channel layer largely affects the mobility of the two-dimensional electron gas. In particular, in an FET having a crystal structure in which InGaP is formed on an InGaAs channel layer as an electron donor layer, the degree of formation of the natural superlattice in the InGaP electron donor layer changes largely depending on the growth conditions for the InGaP crystals. The mobility of the two-dimensional electron gas accordingly changes largely depending on the degree of formation of the natural superlattice.

Depending on the degree of formation of the natural superlattice in the InGaP electron donor layer and the direction of the gate finger, electrons traveling in the channel layer scatter largely to decrease the mobility of the two-dimensional electron gas, and the FET performance that should naturally be obtained cannot be sufficiently obtained.

SUMMARY OF THE INVENTION

The present invention has been made to solve the above problems in the prior art, and has as its object to provide a high-transconductance, high-performance field effect transistor.

In order to achieve the above object, the field effect transistor according to the present invention has the following arrangement. More specifically, in the field effect transistor according to the present invention, an InGaP electron donor layer which forms a natural superlattice is formed on a (001) surface of a GaAs substrate, and a gate finger is formed to run in a [−110] direction.

The field effect transistor according to the present invention is manufactured in the following manner. More specifically, according to the present invention, there is provided a method of manufacturing a field effect transistor having an InGaAs channel layer and an InGaP electron donor layer on a GaAs substrate, wherein growth conditions for InGaP crystal are set to minimize a band gap energy (energy gap) of the InGaP crystal serving as the electron donor layer to be lattice-matched with the GaAs substrate.

The practical growth conditions for the InGaP crystal are:

the supply amount of a source gas of a Group III element is adjusted to set a growing rate of the InGaP crystal at not more than 0.6 μm/h;

a ratio of the source gas of a Group V element to the source gas of the Group III element, i.e., a V/III ratio, during growth of the InGaP crystal is set to fall within a range of 400 to 600;

a growing temperature for the InGaP crystal is set to fall within a range of 640° C. to 660° C.; and a gate finger is formed on a (001) surface of the GaAs substrate to run in a [−110] direction.

Conventionally, among FETs having InGaP formed on their InGaAs channel layer to serve as an electron donor layer, none specifies the state of arrangement of a Group III element of the InGaP crystal.

In the present invention, the InGaP electron donor layer has a crystal structure as described above, and the gate finger is formed to run in the [−110] direction. Hence, electrons in the channel layer travel in the [110] direction, and electrons traveling in the InGaP electron donor layer side of the channel layer scatter less in the interface by the InGaP layer which forms a natural superlattice. Hence, a high-performance FET can be realized.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

A field effect transistor and a method of manufacturing the same according to several preferred embodiments of the present invention will be described below with reference to the accompanying drawings.

Figure 1:
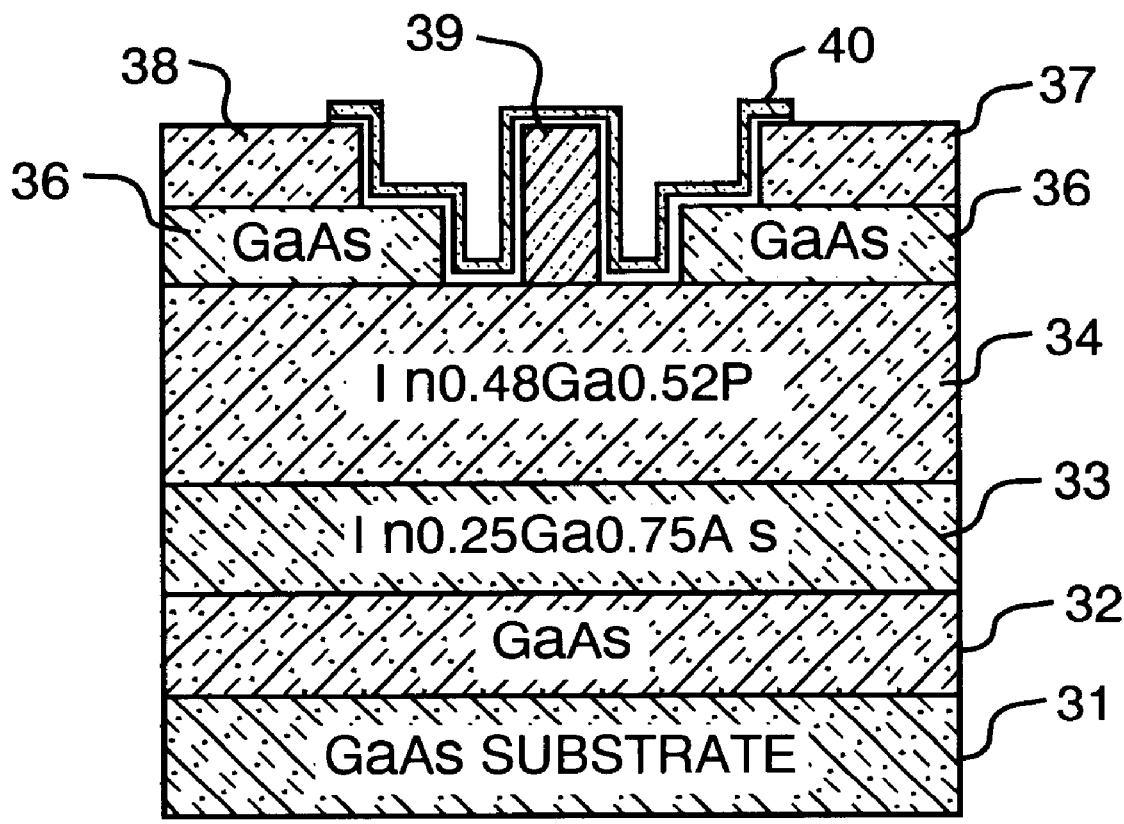
FIG. 1 is a sectional view showing a structure of a conventional field effect transistor.
Figure 2:
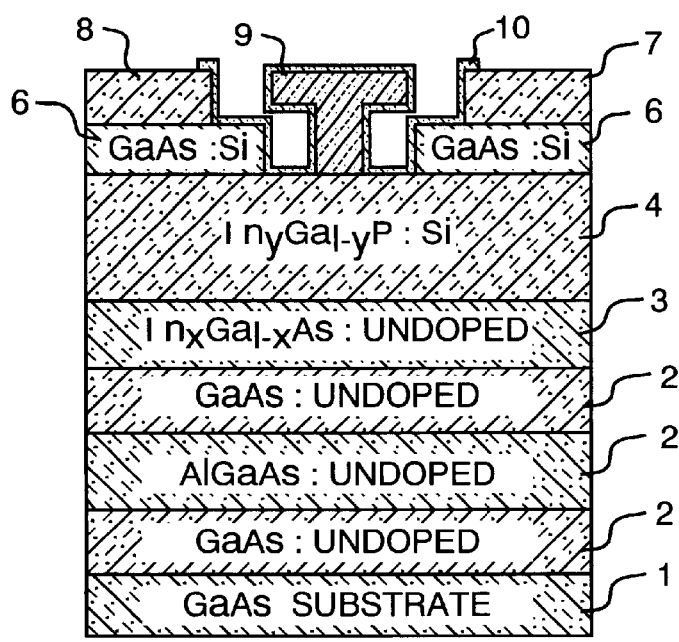
FIG. 2 is a sectional view showing the structure of a field effect transistor according to an embodiment of the present invention.

FIG. 2 is a sectional view showing a field effect transistor according to the first embodiment of the present invention. According to the structure of this field effect transistor, a buffer layer 2 constituted by an undoped GaAs layer, an undoped AlGaAs layer, and an undoped GaAs layer, an undoped $In_xGa_{1-x}As$ channel layer 3, an n-type $In_yGa_{1-y}P$ electron donor layer 4, and an n-type GaAs cap layer 6 are formed on a GaAs substrate 1.

Figure 4:
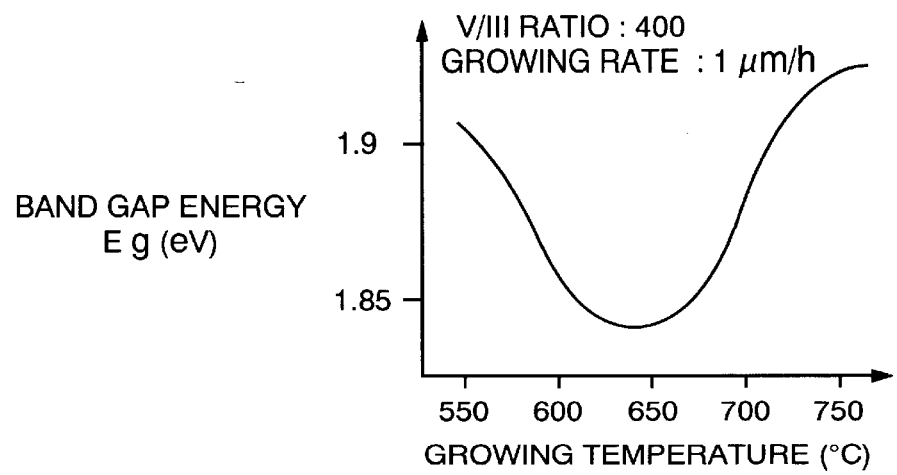
FIG. 4 is a graph showing the relationship between the growing temperature and band gap energy.
Figure 5:
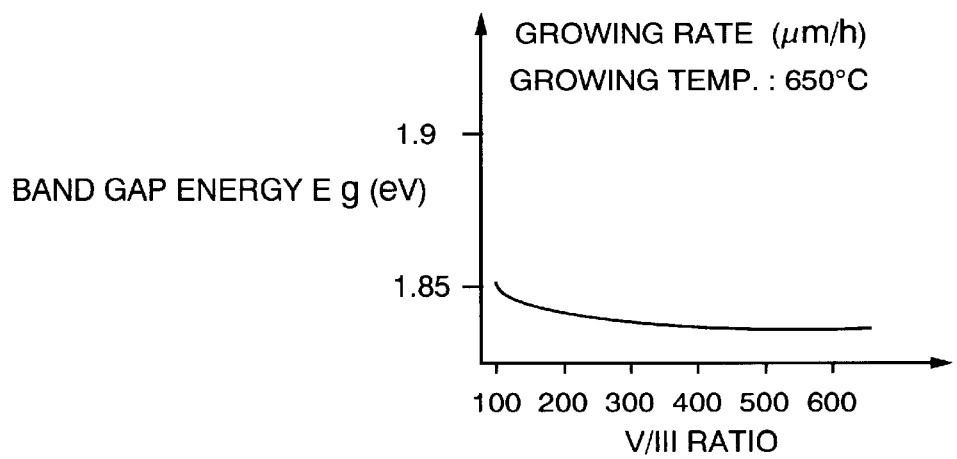
FIG. 5 is a graph showing the relationship between the V/III ratio and band gap energy.
Figure 6:
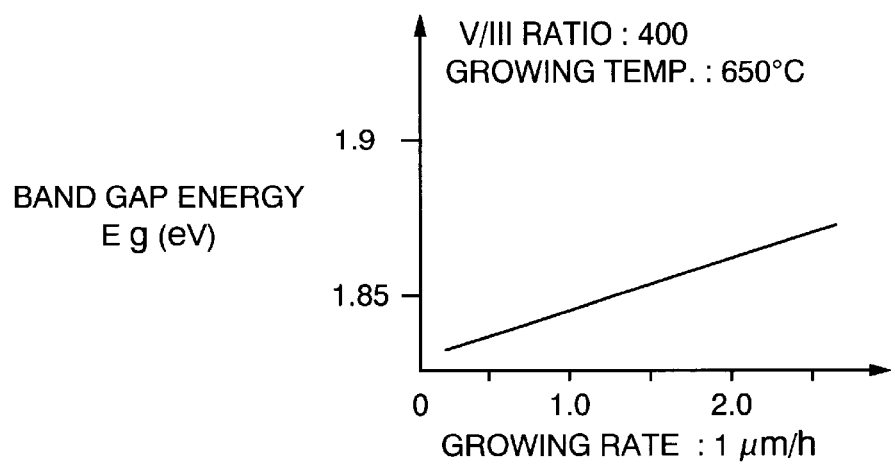
FIG. 6 is a graph showing the relationship between the growing rate and band gap energy.

A band gap energy Eg of InGaP crystal lattice-matched with the GaAs substrate 1 formed by metalorganic vapor phase epitaxy (MOVPE) generally, largely depends on the growing temperature (see FIG. 4), the supply ratio of a source gas of a Group V element to a source gas of a Group III element, i.e., the V/III ratio (see FIG. 5), and the orientation of the GaAs substrate. This is described in, e.g., Japanese Journal of Applied Physics Vol. 27, No. 11, 1988, pp. 2098–2106. The experimental results shown in FIG. 6 indicate that the band gap energy Eg also depends on the crystal growing rate. That is, the higher the growing rate, the larger the band gap energy Eg.

On the basis of these facts, in the crystal growth process of the present invention which aims at obtaining a semiconductor stacked structure shown in FIG. 2 in accordance with MOVPE, crystal growth of the n-type $In_yGa_{1-y}P$ electron donor layer 4 to be formed on the undoped $In_xGa_{1-x}As$ channel layer 3 is performed under the following growth conditions.

Figure 7:
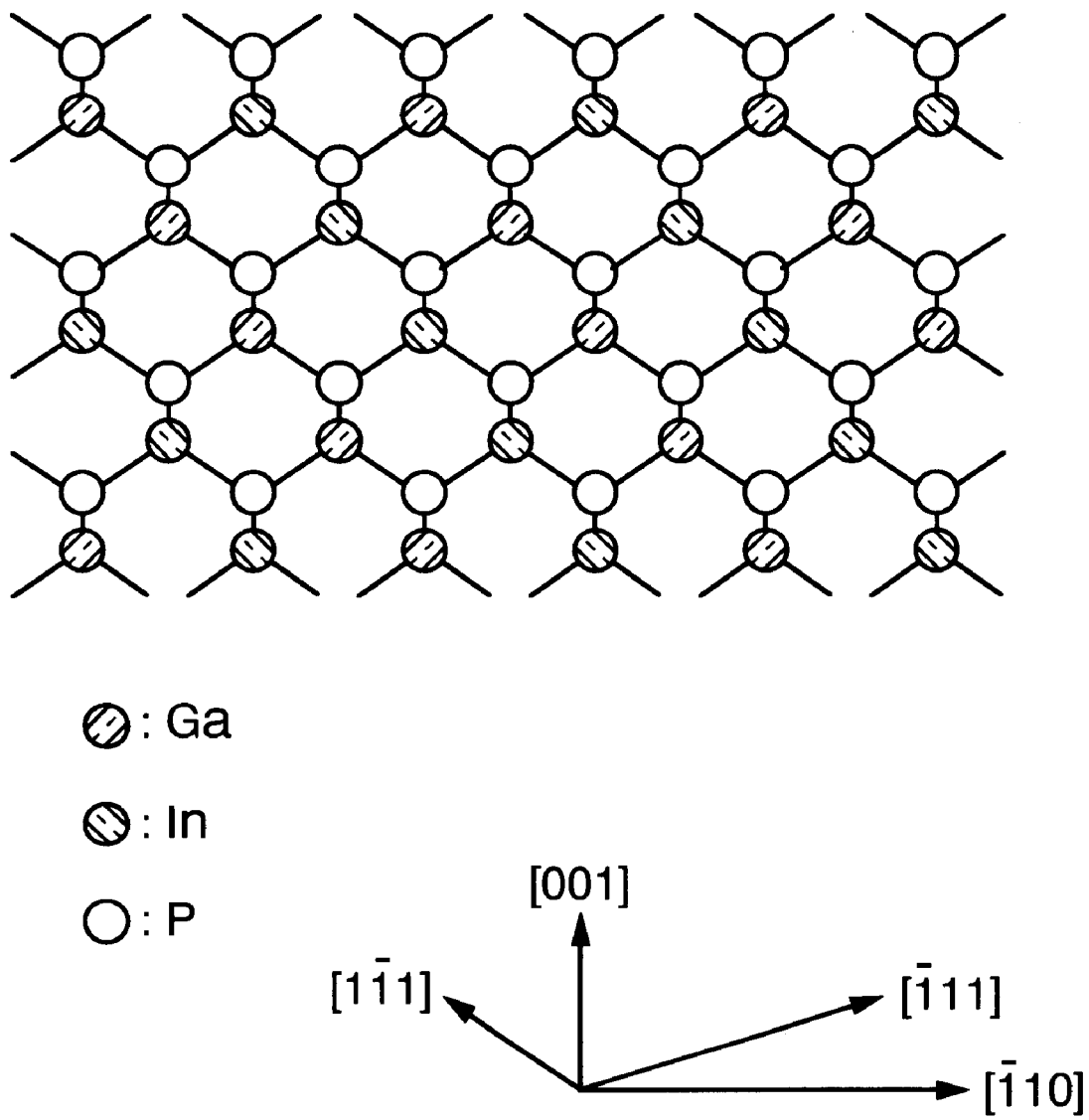
FIG. 7 is a schematic diagram showing the crystal structure of an electron donor layer.

The supply amount of the source gas of the Group III element is adjusted to be equal to 0.6 μm/h or less. The supply ratio of the source gas of the Group V element to the source gas of the Group III element (V/III ratio) is set to fall within the range of 400 to 600. The growing temperature is set to fall within the range of 640° C. to 660° C. Growth conditions with which the band gap energy Eg of the InGaP crystal becomes a minimum (1.845 eV or less) are set. Hence, the InGaP crystal is formed under such conditions that a natural superlattice forms most easily. When InGaP forms a complete natural superlattice, a [−111] superlattice structure, in which Ga and In are stacked alternately as shown in FIG. 7, can be obtained.

After an n-type $In_yGa_{1-y}P$ electron donor layer 4 is formed in this way, an n-type GaAs cap layer 6 is formed on it.

Subsequently, in the gate electrode manufacturing process, first, a photoresist (PR) is applied for recess formation, and a pattern extending in the [−110] is formed by using this photoresist. Only a GaAs cap layer 6 is etched by using crystal selective dry etching such that etching stops on the $In_yGa_{1-y}P$ electron donor layer 4. An oxide film ($SiO_2$) is formed, and an opening for gate electrode formation is formed by dry etching. After that, a gate electrode metal is formed. Finally, the unnecessary portion of the gate electrode metal is removed to form a T-gate in the [−110] direction.

To form an EFT structure, ohmic electrodes, i.e., a source electrode 7 and a drain electrode 8 are formed, and an oxide film ($SiO_2$) serving as a passivation film is formed. As a result, the field effect transistor shown in FIG. 2 is obtained.

Figure 3:
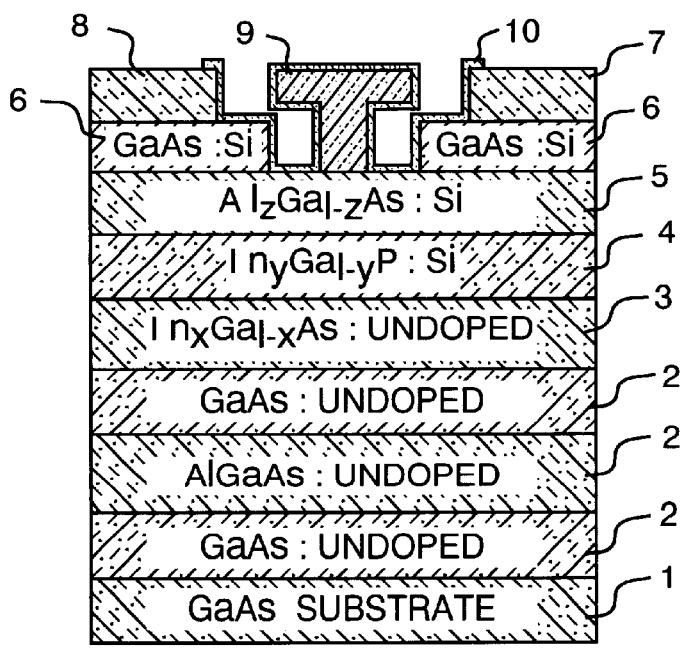
FIG. 3 is a sectional view showing the structure of a field effect transistor according to another embodiment of the present invention.

FIG. 3 is a sectional view showing a field effect transistor according to the second embodiment of the present invention. In the structure of this field effect transistor, a buffer layer 2 constituted by an undoped GaAs layer, an undoped AlGaAs layer, and an undoped GaAs layer, an undoped $In_xGa_{1-x}As$ channel layer 3, an n-type $In_yGa_{1-y}P$ electron donor layer 4, an n-type $Al_zGa_{1-z}As$ Schottky layer 5, and an n-type GaAs cap layer 6 are formed on a GaAs substrate 1. A method of manufacturing the field effect transistor shown in FIG. 3 is the same as a method of manufacturing the field effect transistor of the first embodiment, except that the Schottky layer 5 is formed on the n-type $In_yGa_{1-y}P$ electron donor layer 4, and a detailed description thereof will accordingly be omitted.

The detailed structure shown in FIG. 2 is as follows. A buffer layer 2 comprised of an undoped GaAs layer (300-nm thick), an undoped AlGaAs layer (100-nm thick), and an undoped GaAs layer (50-nm thick), an undoped $In_xGa_{1-x}As$ channel layer 3 (x=0.2, 12-nm thick), a Si-doped n-type $In_yGa_{1-y}P$ electron donor layer 4 (y=0.48, 45-nm thick, $2\times10^{18}$ cm$^{-3}$), and a Si-doped n-type GaAs cap layer 6 (80-nm thick, $3\times10^{18}$ cm$^{-3}$) are sequentially formed on the (001) surface of the GaAs substrate 1.

The detailed structure shown in FIG. 3 is as follows. Different from the structure shown in FIG. 2, a buffer layer 2 comprised of an undoped GaAs layer (300-nm thick), the undoped AlGaAs layer (100-nm thick), and an undoped GaAs layer (50-nm thick), an undoped $In_xGa_{1-x}As$ channel layer 3 (x=0.2, 12-nm thick), a Si-doped n-type $In_yGa_{1-y}P$ electron donor layer 4 (y=0.48, 15-nm thick, $3\times10^{18}$ cm$^{-3}$), a Si-doped $Al_zGa_{1-z}As$ Schottky layer 5 (z=0.2, 40-nm thick, $1\times10^{18}$ cm$^{-3}$), and a Si-doped n-type GaAs cap layer 6 (80-nm thick, $3\times10^{18}$ cm$^{-3}$) are sequentially formed on the (001) surface of the GaAs substrate 1.

In the crystal growth process for obtaining the semiconductor stacked structures of FIGS. 2 and 3 in accordance with MOVPE, growth of particularly the n-type n-type $In_yGa_{1-y}P$ electron donor layer 4 is practically performed under the following growth conditions.

The supply amounts of trimethyl indium and trimethyl gallium, each as a source gas of a Group III element, are adjusted such that the growing rate of InGaP crystal becomes 0.6 μm/h. The supply ratio of the source gas of the Group V element to the source gas of the Group III element (V/III ratio) is set to 500. The growing temperature is set to 650° C. The InGaP crystal is formed in the MOVPE apparatus under such conditions that a natural superlattice forms most easily.

According to the characteristics of the FET fabricated on a trial basis to have the stacked structure shown in FIG. 2, when the recess width was 0.5 μm and the gate length was 0.2 μm, the threshold voltage Vth=−1.2 V, the maximum drain current Imax was about 720 mA/mm, the maximum transconductance gmmax was about 530 mS/mm, and the gate-to-drain breakdown voltage BVgd was about 6 V.

As a comparative example, a semiconductor crystal-stacked FET was fabricated at a growing temperature of 600° C., at a growing rate of 0.6 μm/h, and with a V/III ratio of 500. According to the characteristics of this FET, the maximum drain current Imax was about 660 mA/mm, and the maximum transconductance gmmax was about 490 mS/mm.

This comparative result verifies the effectiveness of the field effect transistor according to the present invention.

What is claimed is:

1. A field effect transistor having an InGaAs channel layer and an InGaP electron donor layer on a GaAs substrate, wherein a natural superlattice is formed in a crystal of said InGaP electron donor layer, and a gate finger is formed to run in a [−110] direction.

2. A transistor according to claim 1, wherein said natural superlattice is formed of a Group III element of the crystal of said InGaP electron donor layer.

3. A transistor according to claim 1, wherein said natural superlattice has a [−111] superlattice structure in which Ga and In are stacked alternately.

* * * * *